United States Patent
Richter et al.

(10) Patent No.: US 8,906,801 B2
(45) Date of Patent: Dec. 9, 2014

(54) PROCESSES FOR FORMING INTEGRATED CIRCUITS AND INTEGRATED CIRCUITS FORMED THEREBY

(75) Inventors: Ralf Richter, Dresden (DE); Hans-Jürgen Thees, Dresden (DE)

(73) Assignee: GlobalFoundries, Inc., Grand Cayman (KY)

( * ) Notice: Subject to any disclaimer, the term of this patent is extended or adjusted under 35 U.S.C. 154(b) by 395 days.

(21) Appl. No.: 13/417,491

(22) Filed: Mar. 12, 2012

(65) Prior Publication Data
US 2013/0234336 A1 Sep. 12, 2013

(51) Int. Cl.
*H01L 21/4763* (2006.01)
*H01L 23/12* (2006.01)
*H01L 21/311* (2006.01)
*H01L 21/768* (2006.01)

(52) U.S. Cl.
CPC ..... *H01L 21/31144* (2013.01); *H01L 21/76879* (2013.01)
USPC ........... 438/620; 438/622; 438/631; 438/638; 438/640; 438/675; 257/700; 257/760; 257/774

(58) Field of Classification Search
CPC ............... H01L 21/76838; H01L 21/76804; H01L 21/76835; H01L 21/7684; H01L 21/76819; H01L 21/76802; H01L 21/76808; H01L 21/31144; H01L 21/76807; H01L 23/5226; H01L 21/02063; H01L 23/53295; H01L 21/76879; H01L 21/76883

USPC ................. 257/700, 701, 758–760, 773, 774; 438/618, 620, 622, 623, 631, 637, 638, 438/640, 672, 673, 675
See application file for complete search history.

(56) References Cited

U.S. PATENT DOCUMENTS

| | | | |
|---|---|---|---|
| 7,119,439 B2 * | 10/2006 | Watanabe et al. | 257/751 |
| 2003/0057561 A1 * | 3/2003 | Fukuyama et al. | 257/774 |
| 2003/0209779 A1 * | 11/2003 | Yu et al. | 257/533 |
| 2007/0018330 A1 * | 1/2007 | Takeda et al. | 257/762 |

* cited by examiner

*Primary Examiner* — Alonzo Chambliss
(74) *Attorney, Agent, or Firm* — Ingrassia Fisher & Lorenz, P.C.

(57) ABSTRACT

Processes for forming integrated circuits and integrated circuits formed thereby are provided in which a first dielectric layer including a first dielectric material is formed on an underlying substrate. A first etch mask having at least two patterned recesses is patterned over the first dielectric layer. At least one first-level via is etched in the first dielectric layer through one patterned recess in the first etch mask with a first etchant, and the first-level via is filled with electrically-conductive material. A second dielectric layer including a second dielectric material is formed over the first dielectric layer. A second etch mask having patterned recesses corresponding to the patterned recesses of the first etch mask is patterned over the second dielectric layer. Second-level vias are etched in the second dielectric layer through the patterned recesses in the second etch mask with a second etchant and exposed to the first etchant.

19 Claims, 5 Drawing Sheets

PROCESSES FOR FORMING INTEGRATED CIRCUITS AND INTEGRATED CIRCUITS FORMED THEREBY

TECHNICAL FIELD

The present invention generally relates to processes for forming integrated circuits and integrated circuits formed by the processes. More particularly, the invention relates to processes for forming vias in dielectric layers within integrated circuits, and integrated circuits formed by the processes.

BACKGROUND

Integrated circuits have been pivotal to accelerating progress in electronic device performance, enabling device sizes to shrink without sacrificing performance. Integrated circuits have been widely adopted for electronic devices, as opposed to designs using discrete transistors, due to various capabilities that are enabled by the integrated circuits. For example, integrated circuits can be readily mass produced, generally exhibit excellent reliability, and enable a building-block approach to circuit design.

Integrated circuits generally include a semiconductor substrate including a device, such as a transistor, disposed therein. In fact, modern integrated circuits may contain millions of transistors disposed therein. Layers of dielectric materials are formed over the semiconductor substrates and may include additional devices embedded therein (such as DRAM devices). Additionally, electrical connections between the devices in the integrated circuit are formed in the layers of dielectric materials. In particular, numerous levels of interconnect routing in the form of electrically-conductive interconnects, such as copper lines and dots, are generally embedded within the layers of dielectric material to connect the devices within the integrated circuits. Each level of interconnect routing is separated from immediately adjacent levels by the dielectric material, referred to in the art as an interlayer dielectric (ILD). Adjacent levels of interconnect routing may be embedded in distinct layers of ILD, and with the interconnect routing configured in such a way so as to ensure that dielectric material separates the adjacent interconnect routings. In this regard, the electrically-conductive interconnects of the interconnect routing can be selectively insulated from both other electrically-conductive interconnects in the same interconnect routing and from electrically-conductive interconnects in interconnect routing of adjacent levels. Likewise, electrically-conductive interconnects in adjacent levels of interconnect routing can also be selectively connected to fabricate desired circuitry in the integrated circuits.

Mass production of integrated circuits, as well as the ability to form millions of devices therein, is made possible in part due to the manner in which adjacent levels of interconnect routing and other structures are connected to each other and to the devices in the semiconductor substrate. To selectively connect adjacent levels of interconnect routing, and also to form other structures in the integrated circuits, successive patterning techniques are generally employed by which a layer of dielectric material is first formed on an underlying substrate, which may be a layer of dielectric material including an adjacent level of interconnect routing or may be the semiconductor substrate including electrical contacts for the devices therein. An etch mask is then formed and patterned over the layer of dielectric material, with the etch mask having patterned recesses that selectively expose a surface of the layer of dielectric material. Vias are then etched into the layer of dielectric material through the patterned recesses in the etch mask, with multiple cycles of masking and etching conducted depending upon the number and type of underlying dielectric layers to be etched through and further depending upon a desired configuration of vias and trenches in the layer of dielectric material. As a result of etching, a surface of the interconnect routing or electrical contact in the underlying substrate can be exposed in the vias. Etch masks are then removed and material is deposited in the vias and trenches, such as electrically-conductive material or other types of depositable material, to form embedded features within the layer of dielectric material. When the deposited material is electrically-conductive, the embedded features formed in the vias and trenches may represent a new level of interconnect routing, and may further serve to interconnect the adjacent levels of interconnect routing or electrical contacts in the underlying substrate. The patterning technique may be repeated in subsequently-formed layers of dielectric materials.

Despite the ability to mass produce integrated circuits, minor defects within integrated circuits can result in device inoperability. For example, although modern patterning techniques are robust, a single missed via or trench, and attendant failure to properly form embedded features in the missing via or trench, may cause failure of the integrated circuit. This is the case even though tens of millions of etched vias and trenches may be formed in a single integrated circuit. Thus, despite the robustness of modern patterning techniques, missed vias remain concerns.

Accordingly, it is desirable to provide processes for forming integrated circuits that address common causes of missed vias during formation of integrated circuits. In addition, it is desirable to provide such processes that can remediate missed vias even after occurrence thereof, thereby salvaging integrated circuits that may otherwise be inoperable. In addition, it is desirable to provide such processes without requiring individual identification of missed vias, which may only occur on the order of once in a million vias or less. In addition, it is desirable to provide such processes while minimizing any impact on properly-formed vias. In addition, it is desirable to provide integrated circuits formed by such processes. Furthermore, other desirable features and characteristics of the present invention will become apparent from the subsequent detailed description of the invention and the appended claims, taken in conjunction with the accompanying drawings and this background of the invention.

BRIEF SUMMARY

Processes for forming integrated circuits and integrated circuits formed by the processes are provided herein. In an embodiment, a first dielectric layer is formed on an underlying substrate. The first dielectric layer includes a first dielectric material. A first etch mask is patterned over the first dielectric layer. The first etch mask has at least two patterned recesses. At least one first-level via is etched in the first dielectric layer through at least one of the patterned recesses in the first etch mask with a first etchant. The at least one first-level via is filled with electrically-conductive material to form a first-level embedded feature within the first dielectric layer. A second dielectric layer is formed over the first dielectric layer and the first-level embedded feature therein. The second dielectric layer includes a second dielectric material that is different from the first dielectric material, and the second dielectric material has a lower etch rate in the first etchant than the first dielectric material. A second etch mask is patterned over the second dielectric layer. The second etch mask has patterned recesses corresponding to the at least two patterned recesses of the first etch mask. Second-level vias are etched in the second dielectric layer through the patterned recesses in the second etch mask with a second etchant that is different from the first etchant. The second-level vias are exposed to the first etchant.

In another embodiment of a process for forming an integrated circuit, a first dielectric layer is formed on an underlying substrate. The first dielectric layer includes a first dielectric material. A first etch mask is patterned over the first dielectric layer. The first etch mask has at least two patterned recesses. At least one first-level via is etched in the first dielectric layer through at least one of the patterned recesses in the first etch mask with a first etchant. The at least one first-level via is filled with electrically-conductive material to form a first-level embedded feature within the first dielectric layer. A second dielectric layer is formed over the first dielectric layer and the first-level embedded feature therein. The second dielectric layer includes a second dielectric material that is different from the first dielectric material. A second etch mask is patterned over the second dielectric layer. The second etch mask has patterned recesses corresponding to the at least two patterned recesses of the first etch mask. A connected second-level via and a disconnected second-level via are etched in the second dielectric layer through the patterned recesses in the second etch mask with a second etchant that is different from the first etchant. The connected second-level via is located over the first-level embedded feature, and etching with the second etchant exposes a surface of the first-level embedded feature in the connected second-level via. The disconnected second-level via is located over an un-etched surface of the first dielectric layer, and etching with the second etchant exposes the un-etched surface of the first dielectric layer in the disconnected second-level via. A first-level via is etched in the first dielectric layer through the disconnected second-level via with the first etchant to form a multi-level via that extends through the second dielectric layer and the first dielectric layer. The connected second-level via and the multi-level via are filled with electrically-conductive material to form a second-level embedded feature and a multi-level embedded feature.

In another embodiment, an integrated circuit is formed by a process including forming a first dielectric layer on an underlying substrate. The first dielectric layer includes a first dielectric material and the underlying substrate includes at least two embedded electrical contacts disposed therein. A first etch mask is patterned over the first dielectric layer. The first etch mask has at least two patterned recesses that are located over the at least two embedded electrical contacts disposed in the underlying substrate. At least one first-level via is etched in the first dielectric layer through at least one of the patterned recesses in the first etch mask with a first etchant. Etching the at least one first-level via exposes a surface of one of the embedded electrical contacts of the underlying substrate in the first-level via. The at least one first-level via is filled with electrically-conductive material to form a first-level embedded feature within the first dielectric layer. The first-level embedded feature is in electrical communication with one of the embedded electrical contacts in the underlying substrate. A second dielectric layer is formed over the first dielectric layer and the first-level embedded feature therein. The second dielectric layer includes a second dielectric material that is different from the first dielectric material. A second etch mask is patterned over the second dielectric layer. The second etch mask has patterned recesses corresponding to the at least two patterned recesses of the first etch mask. A connected second-level via and a disconnected second-level via are etched in the second dielectric layer through the patterned recesses in the second etch mask with a second etchant that is different from the first etchant. The connected second-level via is located over the first-level embedded feature, and etching with the second etchant exposes a surface of the first-level embedded feature in the connected second-level via. The disconnected second-level via is located over an un-etched surface of the first dielectric layer, and etching with the second etchant exposes the un-etched surface of the first dielectric layer in the disconnected second-level via. A first-level via is etched in the first dielectric layer through the disconnected second-level via with the first etchant to form a multi-level via that extends through the second dielectric layer and the first dielectric layer. The connected second-level via and the multi-level via are filled with electrically-conductive material to form a second-level embedded feature and a multi-level embedded feature.

BRIEF DESCRIPTION OF THE DRAWINGS

The present invention will hereinafter be described in conjunction with the following drawing figures, wherein like numerals denote like elements, and wherein.

DETAILED DESCRIPTION

The following detailed description is merely exemplary in nature and is not intended to limit the invention or the application and uses of the invention. Furthermore, there is no intention to be bound by any theory presented in the preceding background or the following detailed description.

Processes for forming integrated circuits and integrated circuits formed by the processes are provided herein. The processes are capable of addressing and remediating missed vias that occur during patterning, etching, and filling of vias in layers of dielectric material during formation of integrated circuits. In particular, the processes described herein can remediate missed vias after occurrence thereof through actions taken during patterning and etching of a subsequently-formed layer of dielectric material upon the layer of dielectric material in which the missed via has occurred. The missed vias are remediated by exposing the subsequently-formed layer of dielectric material and, more particularly, vias formed therein and located over both the missed via as well as properly-formed embedded features, to a first etchant that preferentially etches dielectric material in the layer of dielectric material that has experienced the missed via. If a via was missed, exposing the vias in the subsequently-formed layer to the first etchant may then properly etch the missed via at issue. The vias in both layers of dielectric material are then filled, thereby salvaging integrated circuits that may otherwise be inoperable. In the event that embedded features are properly formed and a via was not missed, the embedded features are substantially resistant to etching in the first etchant such that exposing the vias in the subsequently-formed layer of dielectric material to the first etchant has no material effect on the underlying embedded features. In this regard, the processes described herein can remediate the missed vias while avoiding a material impact on properly-formed vias. Further, because all vias in the subsequently-formed layer of dielectric material may be exposed to the first etchant, individual identification of missed vias is unnecessary as any such missed vias will be remediated as described above.

Figure 1:
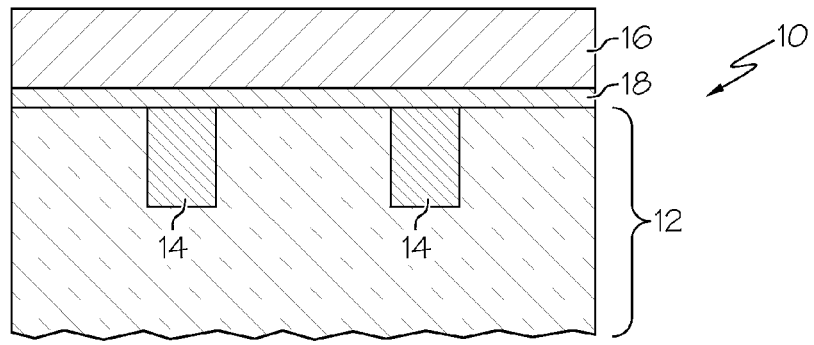
FIG. 1 is a schematic cross-sectional side view of first dielectric layer formed on an underlying substrate.
Figure 6:
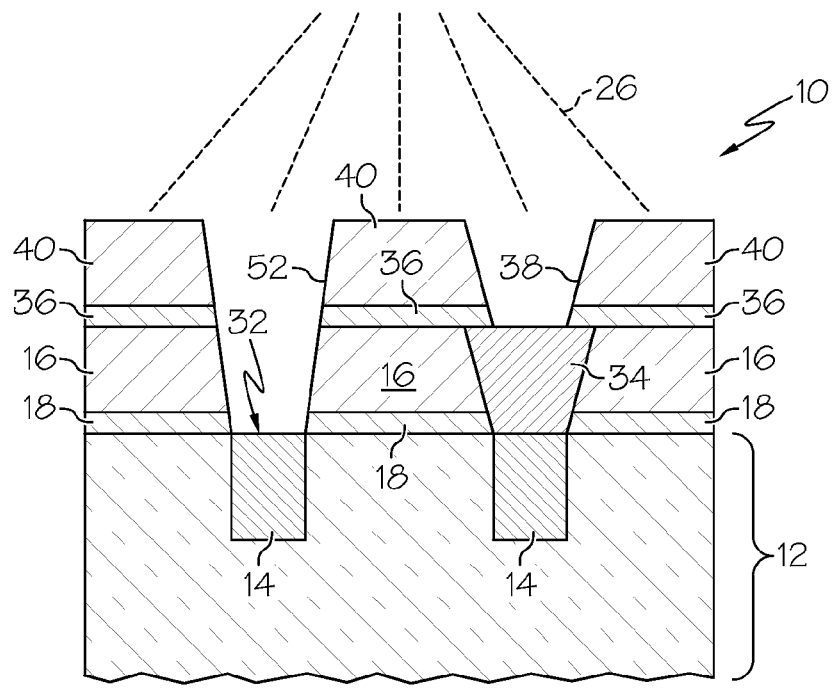
FIG. 6 is a schematic cross-sectional side view of the second-level vias formed as shown in FIG. 5a exposed to the first etchant to form a multi-level via.
Figure 7:
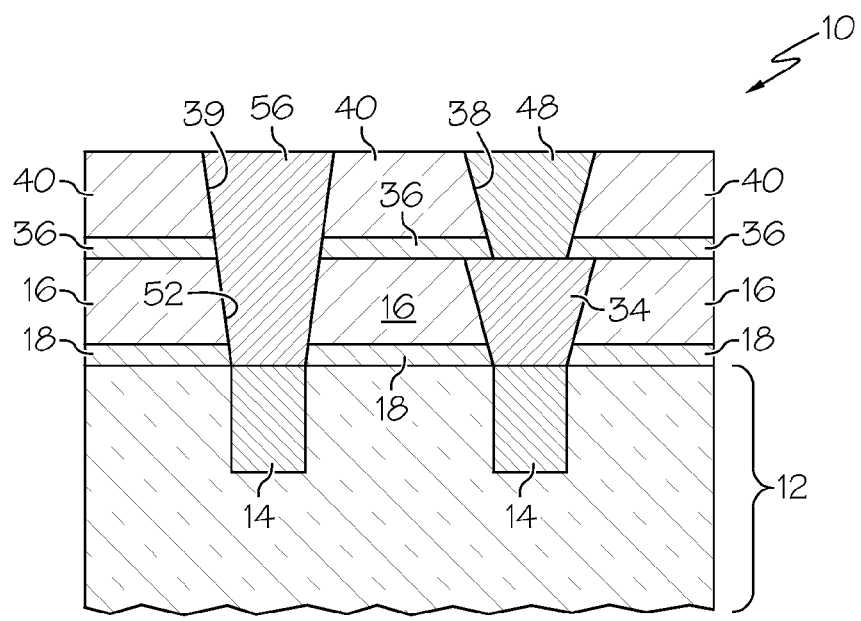
FIG. 7 is a schematic cross-sectional side view of the multi-level via and second-level via of FIG. 6 filled with electrically-conductive material.
Figure 8:
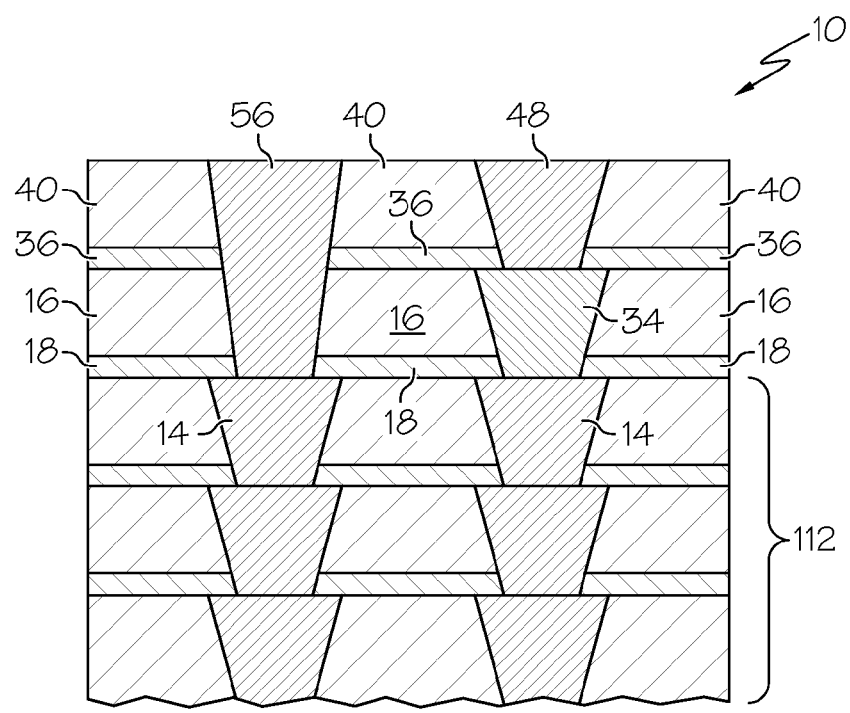
FIG. 8 is a schematic cross-sectional side view of an embodiment of an integrated circuit prepared in accordance with the processes described herein.
Figure 9:
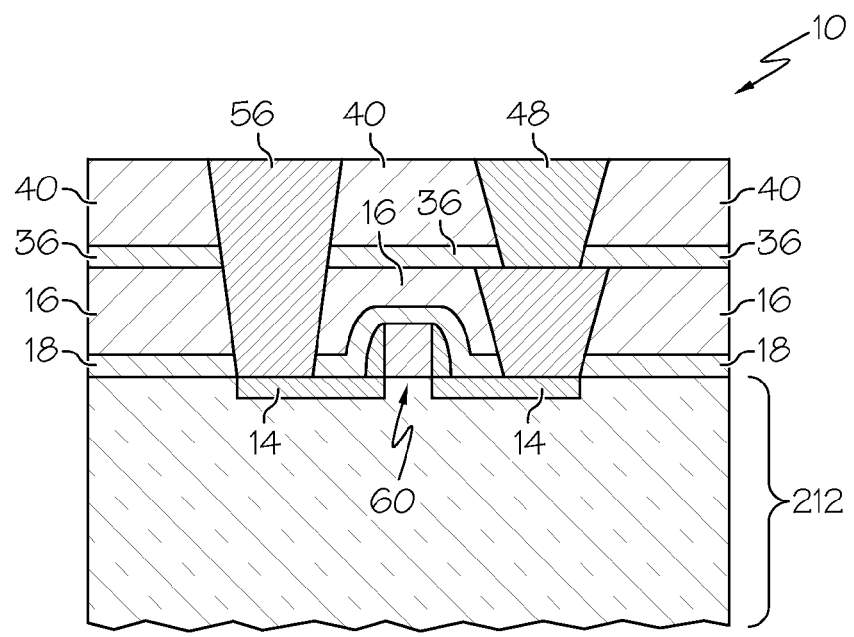
FIG. 9 is a schematic cross-sectional side of another embodiment of an integrated circuit prepared in accordance with the processes described herein.

An exemplary embodiment of a process for forming an integrated circuit 10 will now be addressed with reference to FIGS. 1-7. Referring to FIG. 1, an underlying substrate 12 is provided, upon which layers of dielectric material are formed as described in further detail below. In an embodiment, as shown in FIG. 1, the underlying substrate 12 includes at least two embedded electrical contacts 14, and may include millions of embedded electrical contacts 14, that are disposed in the underlying substrate 12. In this regard, the embedded electrical contacts 14 may be formed with nanometer-scale dimensions, e.g., with dimensions less than $1\times10^{-6}$ mm. As shown in FIG. 8, the underlying substrate 12 may be an underlying dielectric substrate 112 including the at least two embedded electrical contacts 14 disposed therein. Alternatively, as shown in FIG. 9, the underlying substrate 12 may be an underlying semiconductor substrate 212 that includes a device 60, such as a transistor, capacitor, resistor, or the like, with the at least two embedded electrical contacts 14 being in electrical communication with the device 60. Alternatively still, the underlying substrate 12 may be free of embedded electrical contacts 14 disposed therein and may be any substrate upon which layers of dielectric material may be formed.

As also shown in FIG. 1, a first dielectric layer 16 is formed on the underlying substrate 12. The first dielectric layer 16 includes a first dielectric material. In an embodiment, the first dielectric material is an oxide such as, for example, a silicon oxide. Further, the first dielectric material may be a low k or ultra-low k material, such as a silsesquioxane polymer. Such low k or ultra-low k dielectric materials are known in the art and are particularly useful in dielectric layers of integrated circuits. The first dielectric layer 16 may be formed on the underlying substrate 12 through conventional techniques such as spin coating.

In an embodiment, although not shown, the first dielectric layer 16 is disposed directly upon a surface of the underlying substrate 12. In another embodiment, as shown in FIG. 1, at least one additional underlying dielectric layer 18 is disposed between the first dielectric layer 16 and the underlying substrate 12. The additional underlying dielectric layer 18 may be an etch-stop layer or barrier layer that resists etching so as to prevent etching of the first dielectric layer 16 from promulgating to underlying layers. In this regard, the additional underlying dielectric layer 18 may be formed from a different dielectric material from the first dielectric material, such as a silicon nitride or silicon carbide, which may formed through plasma-enhanced chemical vapor deposition (PECVD). Although not shown in FIG. 1, at least one additional overlying dielectric layer, such as a TEOS layer that includes an oxide formed from a tetraethyl orthosilicate (TEOS) source, may be disposed over the first dielectric layer 16, and may be formed through conventional techniques such as chemical vapor deposition (CVD). Configurations of dielectric layers as described above, including the barrier layer, first dielectric layer 16 as described herein, and TEOS layer, are well known in the art of integrated circuit design.

Figure 2A:
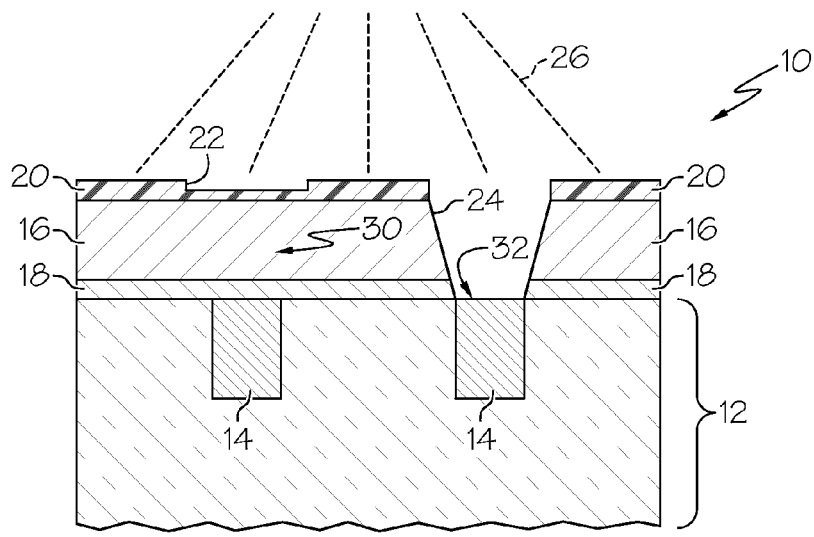
FIG. 2a is a schematic cross-sectional side view of a first etch mask patterned over the first dielectric layer of FIG. 1, with the first etch mask having two patterned recesses and with one first-level via etched in the first dielectric layer through one of the patterned recesses in the first etch mask with a first etchant in accordance with one embodiment.
Figure 2B:
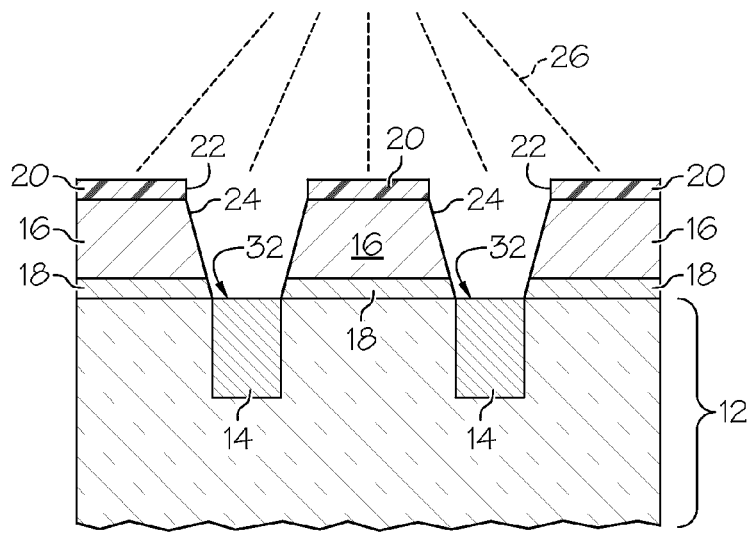
FIG. 2b is a schematic cross-sectional side view of a first etch mask patterned over the first dielectric layer of FIG. 1, with the first etch mask having two patterned recesses and with one first-level via etched in the first dielectric layer through one of the patterned recesses in the first etch mask with a first etchant in accordance with another embodiment.

Referring to FIGS. 2a and 2b, a first etch mask 20 is patterned over the first dielectric layer 16. The first etch mask 20 may be formed through conventional lithography techniques, such as by negative or positive photolithography. Although the first etch mask 20 may be disposed directly upon the first dielectric layer 16, it is to be appreciated that the at least one additional overlying dielectric layer may be disposed between the first etch mask 20 and the first dielectric layer 16. For purposes of the processes described herein, the first etch mask 20 has at least two patterned recesses 22 therein for enabling the underlying first dielectric layer 16 to be etched through the patterned recesses 22, although it is to be appreciated that the first etch mask 20 may have millions of patterned recesses 22 therein. Like the embedded electrical contacts 14 disposed in the underlying substrate 12, the patterned recesses 22 may be formed with nanometer-scale dimensions. In an embodiment, as shown in FIGS. 2a and 2b, the at least two patterned recesses 22 are located over the at least two embedded electrical contacts 14 that are disposed in the underlying substrate 12. However, for purposes of the processes described herein, the patterned recesses 22 in the first etch mask 20 may be configured in any pattern based upon a configuration of vias that are to be etched in the first dielectric layer 16 through the patterned recesses 22.

Under ideal conditions and as shown in FIG. 2b, the at least two patterned recesses 22 in the first etch mask 20 extend completely through the first etch mask 20. However, in some circumstances and as shown in FIG. 2a, one or more of the patterned recesses 22 are incompletely formed, resulting in a partial recess formed in the first etch mask 20 that does not extend completely through the first etch mask 20. As described in further detail below, the processes described herein are effective for forming operational integrated circuits regardless of whether the at least two patterned recesses 22 extend completely through the first etch mask 20, as shown in FIG. 2b, or whether one or more of the patterned recesses 22 are incompletely formed, as shown in FIG. 2a.

Referring again to FIGS. 2a and 2b, at least one first-level via 24 is etched in the first dielectric layer 16 through at least one of the patterned recesses 22 in the first etch mask 20. FIG. 2b illustrates etching of first-level vias 24 in both of the patterned recesses 22 shown, representing typical successful etching. However, FIG. 2a illustrates etching of a first level via 24 in only one of the patterned recesses 22 due to incomplete formation of the other patterned recess 22, which blocks etching of the first dielectric layer 16 and results in a missed via 30. While the incomplete formation of the patterned recess 22, as shown in FIG. 2a, may otherwise result in inoperability of the integrated circuit 10 due to the missed via 30, the missed via 30 is remediated in accordance with the instant process and as described in further detail below.

The at least one first-level via is etched in the first dielectric layer 16 with a first etchant 26. The first etchant 26 may be any etchant that etches the first dielectric material and, in this regard, may be an oxide etchant. The first-level via 24 may be etched through dry etching techniques, also referred to in the art as plasma etching techniques. Examples of suitable oxide etchants include, but are not limited to, $CHF_3$, $CF_4$, or $SF_6$. It is to be appreciated that when the at least one additional overlying dielectric layer is present, an additional etchant may be used to first etch the at least one additional overlying dielectric layer prior to etching the first dielectric layer 16. However, under some circumstances, the first etchant 26 may effectively etch the at least one additional overlying dielectric layer such that an additional etchant may be unnecessary to expose the first dielectric layer 16.

In an embodiment and as shown in FIGS. 2a and 2b, when the at least two patterned recesses 22 are located over the at least two embedded electrical contacts 14 that are disposed in the underlying substrate 12, etching the at least one first-level via 24 exposes a surface 32 of one of the embedded electrical contacts 14 of the underlying substrate 12 in the first-level via 24. Etching the first-level via 24 with the first etchant 26 may be sufficient to expose the surface 32 of the embedded electrical contact 14 in the absence of further etching with additional etchants. However, it is to be appreciated that when the at least one additional underlying dielectric layer 18 is present, an additional etchant may be used to etch the at least one additional underlying dielectric layer 18 after etching the first dielectric layer 16 with the first etchant 26.

Figure 3:
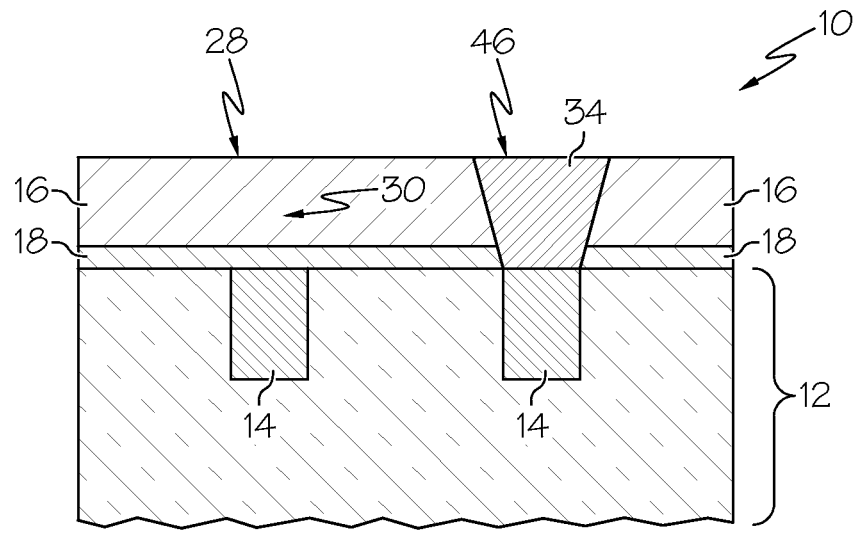
FIG. 3 is a schematic cross-sectional side view of the first-level via in the first dielectric layer, as shown in FIG. 2a, filled with electrically-conductive material to form a first-level embedded feature within the first dielectric layer.

Referring to FIG. 3, after etching the at least one first-level via 24 in the first dielectric layer 16, the at least one first-level via 24 is filled with electrically-conductive material to form a first-level embedded feature 34 within the first dielectric layer 16. While FIG. 3 illustrates filling the at least one first-level via 24 in a scenario in which a via has been missed due to incomplete formation of one of the patterned recesses 22 (as shown in FIG. 2a), it is to be appreciated that all patterned recesses 22 may be properly formed and no vias may be missed, with all first-level vias 24 filled with the electrically-conductive material to form first-level embedded features 34. When the underlying substrate 12 includes the at least two embedded electrical contacts 14 (as shown in FIG. 3), the at least one first-level via 24 may be filled with electrically-conductive material to form the first-level embedded feature 34 in electrical communication with one of the embedded electrical contacts 14 in the underlying substrate 12. In this regard, the additional etch steps described above will be necessary to expose the surface 32 of the embedded electrical contact 14 in the first-level via 24 to be filled if the additional underlying dielectric layer 18 exists. Alternatively, although not shown, it is to be appreciated that the surface 32 of the embedded electrical contacts 14 may remain covered in the first-level vias 24, in which case filling the at least one first-level via 24 may result in formation of the first-level embedded feature 34 that is insulated from the embedded electrical contact 14 in the underlying substrate 12 by the additional underlying dielectric layer 18, as may be desired if the first-level embedded feature 34 is to be a line in interconnect routing that is disposed in the first dielectric layer 16.

The electrically-conductive material that is filled in the at least one first-level via 24 is not particularly limited and can be a metal such as copper, tungsten, titanium, or combinations thereof. However, it is to be appreciated that other electrically-conductive materials that are known for use in integrated circuits, such as titanium nitride, can also be used.

Figure 4:
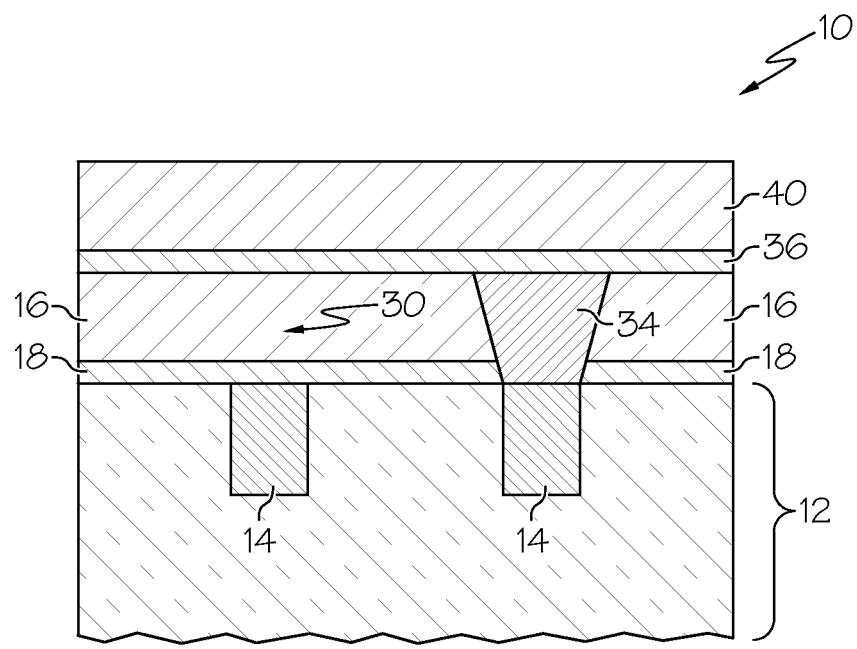
FIG. 4 is a schematic cross-sectional side view of a second dielectric layer formed over the first dielectric layer and the first-level embedded feature of FIG. 3.

Referring to FIG. 4, after filling the at least one first-level via 24 with electrically-conductive material, a second dielectric layer 36 is formed over the first dielectric layer 16 and the first-level embedded feature 34 therein in anticipation of etching second-level vias 38, 39 in the second dielectric layer 36. The second dielectric layer 36 includes a second dielectric material that is different from the first dielectric material and that has a lower etch rate in the first etchant 26 than the first dielectric material for reasons described below. Distinctions in etch rate in different etchants between the first dielectric material and the second dielectric material are the primary differences between the first dielectric material and the second dielectric material, with such distinctions in etch rate exploited to remediate any missed vias in the first dielectric layer 16 as described in further detail below. In an embodiment, the second dielectric material is silicon nitride or silicon carbide. In this regard, the second dielectric material may be the same dielectric material that is present in the at least one additional underlying dielectric layer 18 that is disposed between the first dielectric layer 16 and the underlying substrate 12, as described above.

In an embodiment, the second dielectric layer 36 is formed directly on the first dielectric layer 16. In another embodiment, although not shown, the at least one additional overlying dielectric layer is disposed overlying the first dielectric layer 16 such that the at least one additional overlying dielectric layer can be disposed between the first dielectric layer 16 and the second dielectric layer 36. As shown in FIG. 4, at least one additional dielectric layer 40 may be formed over the second dielectric layer 36 prior to etching the second-level vias 38, 39 in the second dielectric layer 36, and one of the additional dielectric layers formed over the second dielectric layer 36 can be formed from the first dielectric material. In this regard, levels including first dielectric layers and second dielectric layers can be formed in the integrated circuits in alternating fashion, and differences in etch rates between the first dielectric material and the second dielectric material can be exploited to control formation of the embedded electrical features therein.

Figure 5A:
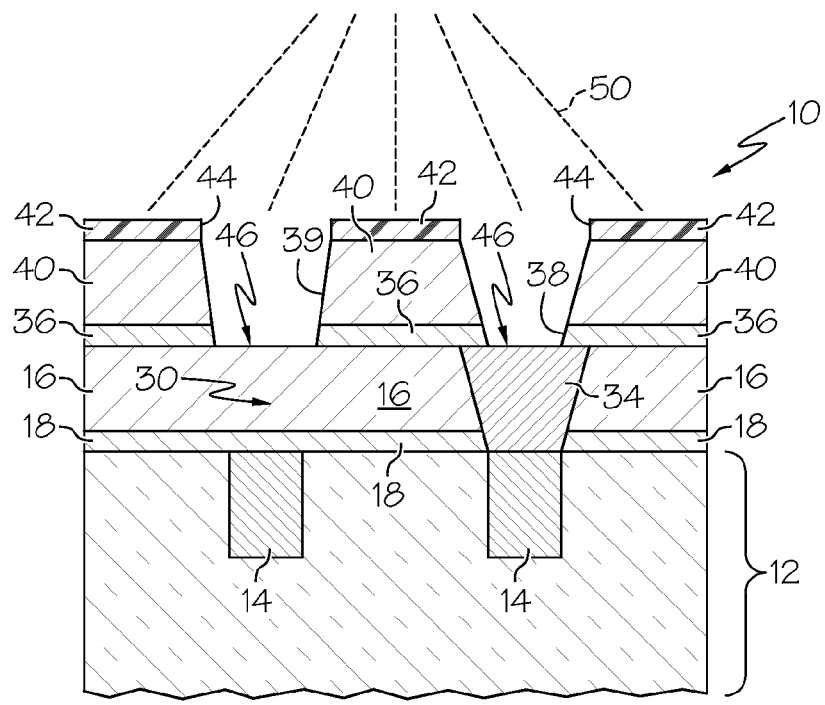
FIG. 5a is a schematic cross-sectional side view of a second etch mask patterned over the second dielectric layer of FIG. 4, with the first etch mask having two patterned recesses corresponding to the at least two patterned recesses of the first etch mask and with second-level vias etched in the second dielectric layer through the patterned recesses in the second etch mask with a second etchant in accordance with one embodiment.
Figure 5B:
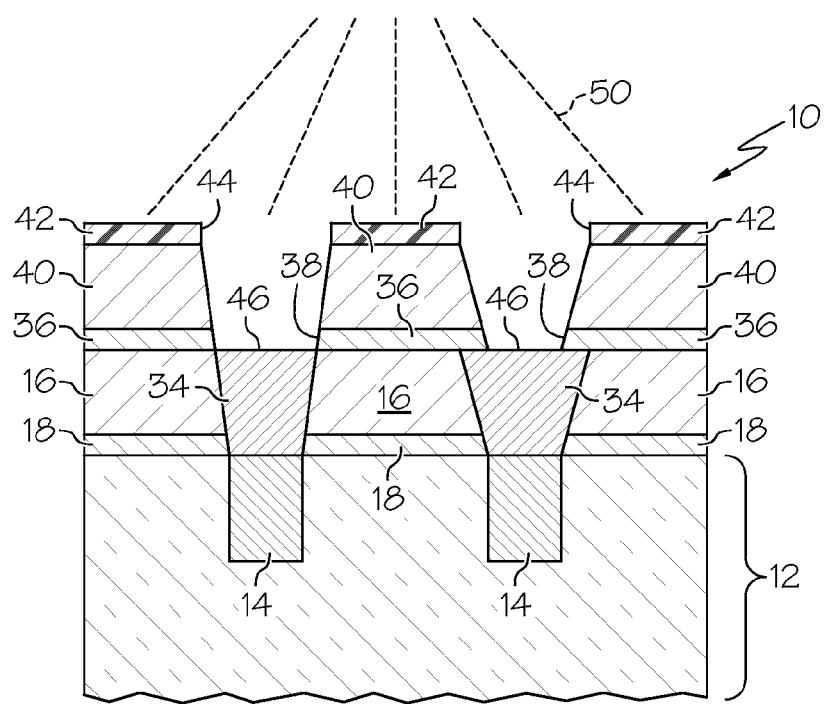
FIG. 5b is a schematic cross-sectional side view of a second etch mask patterned over the second dielectric layer, with first-level embedded features properly formed, with the first etch mask having two patterned recesses corresponding to the at least two patterned recesses of the first etch mask, and with second-level vias etched in the second dielectric layer through the patterned recesses in the second etch mask with a second etchant in accordance with another embodiment.

Referring to FIGS. 5a and 5b, a second etch mask 42 is patterned over the second dielectric layer 36. In an embodiment, the second etch mask 42 is disposed directly upon the second dielectric layer 36. In another embodiment, and as shown in FIGS. 5a and 5b, the at least one additional dielectric layer 40 is disposed on the second dielectric layer 36, and the second etch mask 42 is patterned on the at least one additional dielectric layer 40 that is formed over the second dielectric layer 36. The second etch mask 42 has patterned recesses 44 that correspond to the at least two patterned recesses 22 of the first etch mask 20, with etching through such patterned recesses 44 in the second etch mask 42 generally exposing a surface 46 of the respective underlying first-level embedded features 34 for purposes of forming second-level embedded features 48 in the second dielectric layer 36 that are in electrical communication with the first-level embedded features 34. Because the first etch mask 20 may have millions of patterned recesses 22 therein, the second etch mask 42 may have patterned recesses 44 that correspond to all of the patterned recesses 22 in the first etch mask 20. However, it is to be appreciated that some of the patterned recesses 44 in the second etch mask 42 may be positioned differently than the patterned recesses 22 in the first etch mask 20 depending upon particular designs of the integrated circuit 10.

As also shown in FIGS. 5a and 5b, second-level vias 38, 39 are etched in the second dielectric layer 36 through the patterned recesses 44 in the second etch mask 42 with a second etchant 50 that is different from the first etchant 26. In an embodiment, the second dielectric layer 36 has a higher etch rate in the second etchant 50 than the first dielectric material such that the second etchant 50 preferentially etches the second dielectric material over the first dielectric material. For example, when the second dielectric material is silicon nitride, the second etchant 50 is a nitride etchant. Like with etching the first-level vias 24, the second-level vias 38, 39 may be etched through dry etching techniques, also referred to in the art as plasma etching techniques. Examples of suitable nitride etchants include, but are not limited to, $CHF_3/O_2$ mixtures. It is to be appreciated that when the at least one additional dielectric layer 40 is disposed on the second dielectric layer 36, the second-level vias 38, 39 are etched through the at least one additional dielectric layer 40 and the second dielectric layer 36. In this regard, an additional etchant may be used to first etch the at least one additional dielectric layer 40 prior to etching the second dielectric layer 36. When one of the additional dielectric layers disposed over the second dielectric layer 36 is formed from the first dielectric material, etching the additional dielectric layer with the first etchant 26 continues until the second dielectric layer 36 is reached, whereby etching with the first etchant 26 may be significantly slowed, followed by etching with the second etchant 50 that preferentially etches the second dielectric material. Because the second etch may preferentially etch the second dielectric material over the first dielectric material, the second-level vias 38, 39 can be effectively and uniformly etched.

In an embodiment, as shown in FIG. 5a, etching the second-level vias 38, 39 in the second dielectric layer 36 includes etching a disconnected second-level via 39 in the second dielectric layer 36 through one of the recesses 44 in the second etch mask 42. In this embodiment, the disconnected second-level via 39 is located over an un-etched surface 28 of the first dielectric layer 16. Because the patterned recess 44 in the second etch mask 42 corresponds to a patterned recess 22 in the first etch mask 20, the un-etched surface 28 of the first dielectric layer 16 represents a missed via 30 in the first dielectric layer 16. In an embodiment, the un-etched surface 28 of the first dielectric layer 16 is exposed in the disconnected second-level via 39 after etching the disconnected second-level via 39. The un-etched surface 28 of the first dielectric layer 16 may be exposed by etching the disconnected second-level via 39 through the second dielectric layer 36 with the second etchant 50. In another embodiment, although not shown, the at least one additional overlying dielectric layer is disposed between the first dielectric layer 16 and the second dielectric layer 36, in which case additional etching with additional etchants may be necessary to expose the un-etched surface 28 of the first dielectric layer 16 in the disconnected second-level via 39.

Also in the embodiment shown in FIG. 5a, etching the second-level vias 38, 39 through the second dielectric layer 36 also includes etching a connected second-level via 38 in the second dielectric layer 36 through one of the patterned recesses 44 in the second etch mask 42. Alternatively, FIG. 5b shows connected second-level vias 38 etched in the second dielectric layer 36, with no disconnected second-level vias 39 formed (as would occur during successful etching of the first-level vias 24 and proper filling to form the first-level embedded features 34). The connected second-level via 38 is located over one of the first-level embedded features 34. In an embodiment, the surface 46 of the first-level embedded feature 34 is exposed in the connected second-level via 38 by etching the connected second-level via 38. The surface 46 of the first-level embedded feature 34 may be exposed by etching the connected second-level via 38 through the second dielectric layer 36 with the second etchant 50 alone. However, as set forth above, the at least one additional overlying dielectric layer may be disposed between the first dielectric layer 16 and the second dielectric layer 36 such that additional etching may be necessary to expose the surface 46 of the first-level embedded feature 34 in the connected second-level via 38.

As shown in FIG. 6, after etching the second-level vias 38, 39 in the second dielectric layer 36, the second-level vias 38, 39 are exposed to the first etchant 26. When the at least one additional overlying dielectric layer is disposed between the first dielectric layer 16 and the second dielectric layer 36, the second-level vias 38, 39 are exposed to the first etchant 26 after the additional etching through such additional overlying dielectric layers is conducted. In this regard, either the un-etched surface 28 of the first dielectric layer 16 is exposed in the second-level vias 38, 39 and, thus, is exposed to the first etchant 26, or the surfaces of the first-level embedded features 34 are exposed in the second-level vias 38, 39 and exposed to the first etchant 26.

In an embodiment, as shown in FIG. 6, exposing the second-level vias 38, 39 to the first etchant 26 includes etching a first-level via in the first dielectric layer 16 through the disconnected second-level via 39 to form a multi-level via 52 extending through the second dielectric layer 36 and the first dielectric layer 16. In particular, the first-level via is etched in the un-etched surface 28 of the first dielectric layer 16 that is exposed in the disconnected second-level via 39, thereby forming a multi-level via 52 and remediating the missed via 30 that resulted in the un-etched surface 28 of the first-dielectric layer still being present. When the at least one additional underlying dielectric layer 18 is disposed between the underlying substrate 12 and the first dielectric layer 16, the additional etch steps described above may be necessary to expose the surface 32 of embedded electrical contacts 14 in the multi-level via 52. As also shown in FIG. 6, any connected second-level vias 38 that are exposed to the first etchant 26 include the surface 46 of the first-level embedded feature 34 exposed therein. Due to a generally tapered shape of the second-level vias 38, 39, the first dielectric layer 16 may be shielded from the first etchant 26 in the connected second-level vias 38. Unlike the first dielectric material of the first dielectric layer 16, the first-level embedded feature 34 may be substantially resistant to etching in the first etchant 26. In particular, the electrically-conductive material that forms the first-layer embedded feature may exhibit no material etching in the first etchant 26 such that the first-level embedded feature 34 that is exposed in the connected second-level via 38 remains in place even after exposure to the first etchant 26. In this regard, etching of the first dielectric layer 16 in the connected second-level via 38 is substantially blocked upon exposing the connected second-level via 38 to the first etchant 26, thereby avoiding a material impact on the properly-formed first-level embedded features 34.

After exposing the second-level vias 38, 39 to the first etchant 26, the multi-level vias 52 are formed, as alluded to above, in any disconnected second-level vias 39. Referring to FIG. 7, the connected second-level vias 38 and the multi-level vias 52 that are formed in the disconnected second-level vias 39 may be filled with electrically-conductive material to form second-level embedded features 48 and multi-level embedded features 56, respectively. When the underlying substrate 12 includes the embedded electrical contacts 14, and when the surface 32 of the embedded electrical contacts 14 are exposed in the multi-level via 52, filling the multi-level via 52 with electrically-conductive material may form the multi-level embedded feature 56 in electrical communication with the embedded electrical contact 14 in the underlying substrate 12. In this manner, the consequences of the missed via 30, and attendant missed first-level embedded feature, can be remediated through the processes described herein.

Specific embodiments of the instant processes will now be described with reference to FIGS. 8 and 9, which illustrate integrated circuits that are formed by the processes described herein. Referring first to FIG. 8, the underlying substrate 12 may be an underlying dielectric substrate 112 that includes at least two embedded electrical contacts 14 disposed therein. The embedded electrical contacts 14 in the underlying dielectric substrate 112 may be in electrical communication to electrical contacts disposed in other underlying layers. It is to be appreciated that the underlying dielectric substrate 112 can include millions of the embedded electrical contacts 14 as shown in FIG. 8, and FIG. 8 is only provided to illustrate the benefits provided by the instant processes. A first dielectric layer 16 and a second dielectric layer 36 may be formed and etched as described above, with disconnected second-level vias 39 exposed to a first etchant 26 and multi-level vias 52 also formed as described above. In particular, connected second-level vias 38 and, optionally, any disconnected second-level vias 39, may be etched in the second dielectric layer 36 through patterned recesses 44 in a second etch mask 42, with any disconnected second-level vias 39 located over an un-etched surface 28 of the first dielectric layer 16 and a covered embedded electrical contact 14 in the underlying dielectric substrate 112. The un-etched surface 28 of the first dielectric layer 16 is exposed in the disconnected second-level via 39, optionally after etching any additional overlying dielectric layers that may be disposed between the first dielectric layer 16 and the second dielectric layer 36. The second-level vias 38, 39 are exposed to the first etchant 26, resulting in etching of a first-level via in the first dielectric layer 16 through any disconnected second-level vias 39 with the first etchant 26 to form a multi-level via 52 extending through the second dielectric layer 36 and the first dielectric layer 16. At least one additional dielectric layer 40 may be disposed between the first dielectric layer 16 and the covered embedded electrical contact 14 in the underlying dielectric substrate 112, and the at least one additional dielectric layer 40 may be etched through the multi-level via 52 to expose a surface 32 of the covered embedded electrical contact 14 in the underlying dielectric substrate 112. The second-level vias 38, 39, as well as any multi-level vias 52 that are formed, may then be filled with electrically-conductive material to form a multi-level embedded feature 56 in electrical communication with the embedded electrical contact 14 in the underlying dielectric substrate 112, resulting in the structure as shown in FIG. 8.

Referring now to FIG. 9, the underlying substrate 12 may be an underlying semiconductor substrate 212 that includes a device 60 disposed therein, such as a transistor, capacitor, resistor, or the like. At least two embedded electrical contacts 14 may be disposed in the underlying semiconductor substrate 212, with the at least two embedded electrical contacts 14 in electrical communication with the device 60. It is to be appreciated that the underlying semiconductor substrate 212 can include millions of the devices as shown in FIG. 9, and FIG. 9 is only provided to illustrate the benefits provided by the instant processes. A first dielectric layer 16 and a second dielectric layer 36 may be formed and etched as described above, with disconnected second-level vias 39 exposed to a first etchant 26 and multi-level vias 52 also formed as described above. In particular, connected second-level vias 38 and, optionally, disconnected second-level vias 39, may be etched in the second dielectric layer 36 through patterned recesses 44 in a second etch mask 42, with any disconnected second-level vias 39 located over an un-etched surface 28 of the first dielectric layer 16 and a covered embedded electrical contact 14 in the underlying semiconductor substrate 212. The un-etched surface 28 of the first dielectric layer 16 is exposed in the disconnected second-level via 39, optionally after etching any additional overlying dielectric layers that may be disposed between the first dielectric layer 16 and the second dielectric layer 36. The second-level vias 38, 39 are exposed to the first etchant 26, resulting in etching of a first-level via in the first dielectric layer 16 through any disconnected second-level vias 39 with the first etchant 26 to form a multi-level via 52 extending through the second dielectric layer 36 and the first dielectric layer 16. At least one additional dielectric layer 40 may be disposed between the first dielectric layer 16 and the covered embedded electrical contact 14, and the at least one additional dielectric layer 40 may be etched through the multi-level via 52 to expose a surface 32 of the covered embedded electrical contact 14 in the underlying semiconductor substrate 212. The second-level vias 38, 39, as well as any multi-level vias 52 that are formed, may then be filled with electrically-conductive material to form a multi-level embedded feature 56 in electrical communication with the embedded electrical contact 14 in the underlying semiconductor substrate 212, resulting in the structure as shown in FIG. 9.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention. It being understood that various changes may be made in the function and arrangement of elements described in an exemplary embodiment without departing from the scope of the invention as set forth in the appended claims.

What is claimed is:

1. A process for forming an integrated circuit, said process comprising:

forming a first dielectric layer on an underlying substrate, the first dielectric layer comprising a first dielectric material;

patterning a first etch mask over the first dielectric layer, the first etch mask having at least two patterned recesses;

etching at least one first-level via in the first dielectric layer through at least one of the patterned recesses in the first etch mask with a first etchant;

filling the at least one first-level via with electrically-conductive material to form a first-level embedded feature within the first dielectric layer;

forming a second dielectric layer over the first dielectric layer and the first-level embedded feature therein, the second dielectric layer comprising a second dielectric material different from the first dielectric material wherein the second dielectric material has a lower etch rate in the first etchant than the first dielectric material;

patterning a second etch mask over the second dielectric layer, the second etch mask having patterned recesses corresponding to the at least two patterned recesses of the first etch mask;

etching second-level vias in the second dielectric layer through the patterned recesses in the second etch mask with a second etchant different from the first etchant; and exposing the second-level vias to the first etchant;

wherein etching the second-level vias in the second dielectric layer comprises etching a disconnected second-level via in the second dielectric layer through one of the patterned recesses in the second etch mask, the disconnected second-level via located over an un-etched surface of the first dielectric layer.

2. The process of claim 1, wherein the underlying substrate comprises at least two embedded electrical contacts disposed therein, and wherein patterning the first etch mask is further defined as patterning the first etch mask having the at least two patterned recesses located over the at least two embedded electrical contacts disposed in the underlying substrate.

3. The process of claim 2, wherein etching the at least one first-level via exposes a surface of one of the embedded electrical contacts of the underlying substrate in the first-level via, and wherein filling the at least one first-level via is further defined as filling the at least one first-level via with electrically-conductive material to form the first-level embedded feature in electrical communication with one of the embedded electrical contacts in the underlying substrate.

4. The process of claim 1, wherein etching the disconnected second-level via exposes the un-etched surface of the first dielectric layer, and wherein exposing the second-level vias to the first etchant comprises etching a first-level via in the first dielectric layer through the disconnected second-level via to form a multi-level via extending through the second dielectric layer and the first dielectric layer.

5. The process of claim 4, further comprising filling the multi-level via with electrically-conductive material to form a multi-level embedded feature in the first dielectric layer and the second dielectric layer.

6. The process of claim 1, wherein etching the second-level vias through the second dielectric layer comprises etching a connected second-level via in the second dielectric layer through one of the patterned recesses in the second etch mask, the connected second-level via located over one of the first-level embedded features.

7. The process of claim 6, wherein a surface of the first-level embedded feature in the connected second-level via is exposed by etching the connected second-level via through the second dielectric layer, wherein the first-level embedded feature is substantially resistant to etching in the first etchant, and wherein etching of the first dielectric layer in the second-level via is substantially blocked upon exposing the connected second-level via to the first etchant.

8. The process of claim 7, further comprising filling the connected second-level via with electrically-conductive material to form a second-level embedded feature in the second dielectric layer.

9. The process of claim 1, wherein forming the first dielectric layer on the underlying substrate is further defined as forming the first dielectric layer on an underlying semiconductor substrate including a device disposed therein, wherein at least two embedded electrical contacts are disposed in the underlying semiconductor substrate and wherein the at least two embedded electrical contacts are in electrical communication with the device.

10. The process of claim 9, wherein:
the disconnected second-level via is further located over a covered embedded electrical contact in the underlying semiconductor substrate, with the un-etched surface of the first dielectric layer exposed in the disconnected second-level via, and
exposing the second-level vias to the first etchant comprises etching a first-level via in the first dielectric layer through the disconnected second-level via with the first etchant to form a multi-level via extending through the second dielectric layer and the first dielectric layer.

11. The process of claim 10, wherein at least one additional underlying dielectric layer is disposed between the first dielectric layer and the covered embedded electrical contact, and wherein the at least one additional underlying dielectric layer is etched through the multi-level via to expose a surface of the covered embedded electrical contact in the underlying semiconductor substrate.

12. The process of claim 11, further comprising filling the multi-level via with electrically-conductive material to form a multi-level embedded feature in electrical communication with the embedded electrical contact in the underlying semiconductor substrate.

13. The process of claim 1, wherein forming the first dielectric layer on the underlying substrate is further defined as forming the first dielectric layer on an underlying dielectric substrate including at least two embedded electrical contacts disposed therein.

14. The process of claim 13, wherein:
the disconnected second-level via is further located over a covered embedded electrical contact in the underlying dielectric substrate, with a surface of the first dielectric layer exposed by etching the disconnected second-level via, and
exposing the second-level vias to the first etchant comprises etching a first-level via in the first dielectric layer through the disconnected second-level via with the first etchant to form a multi-level via extending through the second dielectric layer and the first dielectric layer.

15. The process of claim 14, wherein at least one additional underlying dielectric layer is disposed between the first dielectric layer and the covered embedded electrical contact in the underlying dielectric substrate, and wherein the at least one additional underlying dielectric layer is etched through the multi-level via to expose a surface of the covered embedded electrical contact in the underlying dielectric substrate.

16. The process of claim 15, further comprising filling the multi-level via with electrically-conductive material to form a multi-level embedded feature in electrical communication with the embedded electrical contact in the underlying dielectric substrate.

17. The process of claim 1, further comprising forming at least one additional overlying dielectric layer over the second dielectric layer prior to etching the second-level vias in the second dielectric layer, wherein patterning the second etch mask over the second dielectric layer is further defined as patterning the second etch mask on the at least one additional overlying dielectric layer, and wherein the second-level vias are etched through the at least one additional overlying dielectric layer and the second dielectric layer.

18. A process for forming an integrated circuit, said process comprising:
    forming a first dielectric layer on an underlying substrate, the first dielectric layer comprising a first dielectric material;
    patterning a first etch mask over the first dielectric layer, the first etch mask having at least two patterned recesses;
    etching at least one first-level via in the first dielectric layer through at least one of the patterned recesses in the first etch mask with a first etchant;
    filling the first-level via with electrically-conductive material to form a first-level embedded feature;
    forming a second dielectric layer over the first dielectric layer and the first-level embedded feature therein, the second dielectric layer comprising a second dielectric material different from the first dielectric material;
    patterning a second etch mask over the second dielectric layer, the second etch mask having patterned recesses corresponding to the at least two patterned recesses of the first etch mask;
    etching a connected second-level via and a disconnected second-level via in the second dielectric layer through the patterned recesses in the second etch mask with a second etchant different from the first etchant, with the connected second-level via located over the first-level embedded feature to expose a surface of the first-level embedded feature in the connected second-level via, and with the disconnected second-level via located over an un-etched surface of the first dielectric layer to expose the un-etched surface of the first dielectric layer in the disconnected second-level via;
    etching a first-level via in the first dielectric layer through the disconnected second-level via with the first etchant to form a multi-level via extending through the second dielectric layer and the first dielectric layer; and
    filling the connected second-level via and the multi-level via with electrically-conductive material to form a second-level embedded feature and a multi-level embedded feature.

19. An integrated circuit formed by a process comprising:
    forming a first dielectric layer on an underlying substrate, the first dielectric layer comprising a first dielectric material and the underlying substrate comprising at least two embedded electrical contacts disposed therein;
    patterning a first etch mask over the first dielectric layer, the first etch mask having at least two patterned recesses located over the at least two embedded electrical contacts disposed in the underlying substrate;
    etching at least one first-level via in the first dielectric layer through at least one of the patterned recesses in the first etch mask with a first etchant, wherein etching the at least one first-level via exposes a surface of one of the embedded electrical contacts of the underlying substrate in the first-level via;
    filling the at least one first-level via with electrically-conductive material to form a first-level embedded feature within the first dielectric layer, the first-level embedded feature in electrical communication with one of the embedded electrical contacts in the underlying substrate;
    forming a second dielectric layer over the first dielectric layer and the first-level embedded feature therein, the second dielectric layer comprising a second dielectric material different from the first dielectric material;
    patterning a second etch mask over the second dielectric layer, the second etch mask having patterned recesses corresponding to the at least two patterned recesses of the first etch mask;
    etching a connected second-level via and a disconnected second-level via in the second dielectric layer through the patterned recesses in the second etch mask with a second etchant different from the first etchant, with the connected second-level via located over the first-level embedded feature to expose a surface of the first-level embedded feature in the connected second-level via, and with the disconnected second-level via located over an un-etched surface of the first dielectric layer to expose the un-etched surface of the first dielectric layer in the disconnected second-level via;
    etching a first-level via in the first dielectric layer through the disconnected second-level via with the first etchant to form a multi-level via extending through the second dielectric layer and the first dielectric layer; and
    filling the connected second-level via and the multi-level via with electrically-conductive material to form a second-level embedded feature and a multi-level embedded feature.

* * * * *